(12) United States Patent
Bourrieres

(10) Patent No.: US 6,689,412 B1
(45) Date of Patent: Feb. 10, 2004

(54) METHOD FOR MAKING CONNECTION BALLS ON ELECTRONIC CIRCUITS OR COMPONENTS

(75) Inventor: Francis Bourrieres, Montauban (FR)

(73) Assignee: Societe Novatec S.A., Montauban (FR)

( * ) Notice: Subject to any disclaimer, the term of this patent is extended or adjusted under 35 U.S.C. 154(b) by 0 days.

(21) Appl. No.: 09/403,598

(22) PCT Filed: Apr. 27, 1998

(86) PCT No.: PCT/FR98/00837

§ 371 (c)(1),
(2), (4) Date: Aug. 28, 2000

(87) PCT Pub. No.: WO98/49725

PCT Pub. Date: Nov. 5, 1998

(30) Foreign Application Priority Data

Apr. 28, 1997 (FR) .............................................. 97 05435
Jun. 24, 1997 (FR) .............................................. 97 07819

(51) Int. Cl.⁷ .............................. B05D 5/12; B23K 31/02
(52) U.S. Cl. ........................ 427/58; 427/123; 427/282; 427/372.2; 427/379; 228/180.21; 228/180.22
(58) Field of Search ........................ 228/180.21, 180.22; 427/282, 58, 96, 123, 372.2, 379

(56) References Cited

U.S. PATENT DOCUMENTS

| | | | |
|---|---|---|---|
| 5,346,118 A | | 9/1994 | Degani et al. ......... 228/180.22 |
| 5,539,153 A | * | 7/1996 | Schwiebert et al. ......... 174/260 |
| 5,587,342 A | * | 12/1996 | Lin et al. ..................... 437/209 |
| 5,658,827 A | | 8/1997 | Aulicino et al. ....... 228/180.22 |
| 5,872,051 A | * | 2/1999 | Fallon et al. ................ 438/616 |
| 5,934,545 A | * | 8/1999 | Gordon ....................... 228/191 |

FOREIGN PATENT DOCUMENTS

EP  0 469 848 A2  2/1992
EP  0 753 988 A2  1/1997

* cited by examiner

*Primary Examiner*—Brian K. Talbot
(74) *Attorney, Agent, or Firm*—Vidas,Arrett&Steinkraus PA

(57) ABSTRACT

The invention concerns a method for producing and soldering electrical connection beads (1) on mounting lands (2) for electronic circuit or component (3) electrical connection. The invention further concerns the device for implementing said method. The invention is characterized in that it essentially comprises the following steps: the operations for filling the stencil screen openings (4) by means of a squeegee (6) or the like and hot refusion are carried out with the stencil screen positioned above the substrate; the stencil screen (4) positioned on the component (3) during refusion is separated from the component after refusion but before the beads (1) are solidified, the latter being still in liquid state such that the balls that are being formed acquire their balanced position and their strictly identical spherical shape whatever their number; after the beads are solidified, the denatured binder is cleaned out.

12 Claims, 5 Drawing Sheets

METHOD FOR MAKING CONNECTION BALLS ON ELECTRONIC CIRCUITS OR COMPONENTS

FIELD OF THE INVENTION

This invention refers to a process for making and soldering electrical connection beads on electrical connection contact surfaces of electronic circuits or components. This invention also refers to a device for implementing the process of the invention.

BACKGROUND OF THE INVENTION

Making electrical connections of electronic components with metal beads is a known practice. One of the known techniques consists in making the beads and then putting them on the components. These beads are manufactured separately to the desired diameter using an alloy such as, for example, a tin or lead alloy. They are picked up by a mechanical device and then dipped in flux and finally deposited on the contact surfaces of the component.

The soldering is done in an oven.

This process has the benefit of producing perfectly calibrated beads. However, making these beads is costly. The price is roughly one centime per bead. In addition, the operation is a two-step one: one step to manufacture the beads and another one to install them, thus increasing the cost of the component.

The second known technique consists in making the beads directly by melting solder paste and depositing it by silk-screening on the contact surfaces of the component. This method is highly productive in terms of implementation and very attractive in terms of price, since these beads cost only two fifths as much as those of the foregoing technique. But this technique can only be used for small beads.

The solder paste consists of approximately 50% metal by volume, with the remainder consisting of an organic part or flux necessary to transfer the paste adequately by silk-screening, by giving it the appropriate rheology properties. After reflow, only the metal portion of the volume deposited in each hole of the stencil participates in the making of the bead by coalescence. The desired dimensions of the beads and the pitch between the beads lead to the definition of a maximum hole in the stencil and the stencil's thickness. At a given hole diameter it will not be possible to exceed a certain thickness value of the stencil; otherwise, the dot of solder paste will not detach completely from the stencil and a portion of the paste will cling to the stencil. After reflow, the bead will be smaller.

With this technique, it will not be possible to achieve suitable bead sizes and, especially, perfect regularity between the beads, because some solder paste will always be dragged on the stencil even if the stencil has appropriate dimensions.

Patent EP 0 753 988 describes a method for shaping solder beads on a substrate. This method consists in using one or several stencils (10) with nozzles (14) into which solder paste is inserted (18). The bottom of the stencil nozzles is plugged with a thin plate (12). The paste filling the nozzles is melted to separate the metal portion, for soldering, from foreign matter (24) which rises to the surface. To avoid the soldering plug which was shaped from falling when removing the plate (12), the upper extremity of the stencil nozzles is covered with another plate (26) and then the stencil is turned around. The plate (12) can then be pulled out. After turning the stencil around again, the stencil nozzles are positioned above the areas to be soldered. By raising the temperatures, the soldering plugs melt and become deposited on the area to be soldered in the shape of a ball.

U.S. Pat. No. 5,346,118 describes an assembly method by way of soldering of electronic components and a method for shaping soldering beads onto one or several components for their assembly. The soldering beads are made with a stencil with conic or pyramid-shaped nozzles filled with solder paste. This patent provides much data on the shape of the stencil nozzles and the composition of the solder paste, but defines imprecisely the method for producing the beads.

U.S. Pat. No. 5,346,118 describes a procedure for laying down sufficient solder paste on a substrate to form large enough beads by way of reflow. In this patent, the inventor found a means of unmolding the solder paste by way of conic openings. This patent shows the usual known silk-screen process consisting of:

1—Laying out the solder paste with a serigraph onto a substrate;
2—Removing the stencil at ambient temperature and prior to reflow;
3—Do the reflow.

The novelty of this patent is limited to the conical holes facilitating the unmolding, but increasing the difficulty of the filling in, and hence the volumes of deposited paste are not necessarily identical.

U.S. Pat. No. 5,658,827 describes a method for producing soldering beads on a substrate by using a stencil. In this patent, the separation of the stencil and the substrate is conducted after cooling, requiring to produce a second reflow.

If the stencil acting as the mold is removed after solidification of the alloy following the reflow, we find that the alignment of the beads along the "x" and "y" axes defining the plane on which they are resting is imperfect. One also encounters variations in the height and shape of the beads that may make the end result fall outside the tolerances of the JEDEC standard.

These excessive height and shape variations and this misalignment, or poor alignment, are due to the mechanical constraints imposed first of all by the flux residues during solidification of the alloy since, at that time, the volume available in the mold is shared between the alloy and the residues. Secondly, even a very slight incorrect centering of the stencil-mold with respect to the tabs of the contact surfaces, which is always possible, is likely to create an imbalance of the bead produced by the reflow. Indeed, the bead will naturally seek a position of equilibrium and, for this reason, will assume a non-spherical position allowing it to balance the surface tensions which, in this case, are being exerted in a non-symmetrical fashion.

These defects can be overcome by performing a second reflow after the initial reflow, solidification, and removal of the stencil-mold. Provided that the residues of the denatured flux have been eliminated, since the beads do not undergo any external stress from the stencil-mold, which is absent at this stage of the process, the beads must theoretically find their equilibrium position and assume perfectly aligned positions and a spherical shape.

In actuality, the second reflow is not itself sufficient, since the flux has been denatured and eliminated by cleaning, and the end result will not be perfect with regard to the alignment of the beads and their spherical shape and/or their height or diameter. Some solder flux must first be added prior to the second reflow.

After that, the denatured flux will have to be removed by another cleaning. For this reason, this process with two reflows appears to be particularly complex.

SUMMARY OF THE INVENTION

The invention concerns a method allowing to obtain very uniform balls with an excellent alignment along the "x" and "y" axes, defining the plane on which they are laid out. To this end, the process of this invention for making and soldering electrical connection beads on the electrical-connection contact surfaces of electronic components is characterized essentially by the fact that:

- it uses solder paste having appropriate rheology properties comprising metal microbeads capable of coalescing and being soldered on the metal contact surface and a binder;
- said paste is deposited on the contact surface or surfaces by silk-screening;
- the stencil used for this purpose has a thinness, hole dimension, and hole spacing determined according to the pitch of the beads to be made and their desired diameter;
- after the holes in the stencil have been filled with a scraper or a spreading tool such as that described in U.S. application Ser. No. 09/646412, another high temperature reflow is performed;
- during this reflow, the stencil is kept in place on the component and it is separated from the component during or after the reflow, but prior to solidification of the beads, with the beads still being in the molten state so that the beads, as they are forming, find their equilibrium position on their own;
- a cleaning of the denatured flux or binder is done after solidification of the beads.

Since the stencil serving as the mold is removed while the beads are still in the unsolidified liquid state, even if there is poor alignment of the stencil with the circuit at this stage, it does not prevent the beads from wetting the contact surface.

A minimum amount of contact surface placed opposite the molten alloy is enough to hold the molten alloy when the stencil is removed.

When the stencil is removed, the bead or beads are deformed by the stresses they undergo as a result of the friction on the walls of the holes in the stencil as well as the surface energy of these walls. Still, since the stencil used by the invention is not wettable and has a low surface energy, the beads remain adhered to their contact surfaces.

Once the bead is free from the hole in the stencil where it was created, it can assume its final position perfectly in the center of the contact surface and acquire a perfectly spherical shape, given that the molten alloy is no longer subjected to any mechanical action either by the stencil or by the residues of binder or flux since, at this time, they are in the liquid state and their density is considerably lower than that of the molten alloy.

For this reason, these liquid residues do not cause any significant resistance while the alloy is taking on a spherical shape.

DESCRIPTION OF THE DRAWINGS

Other benefits and features of the invention will become clear upon reading the following description of the invention illustrated with the attached drawings in which.

DETAILED DESCRIPTION OF THE INVENTION

Figure 1:
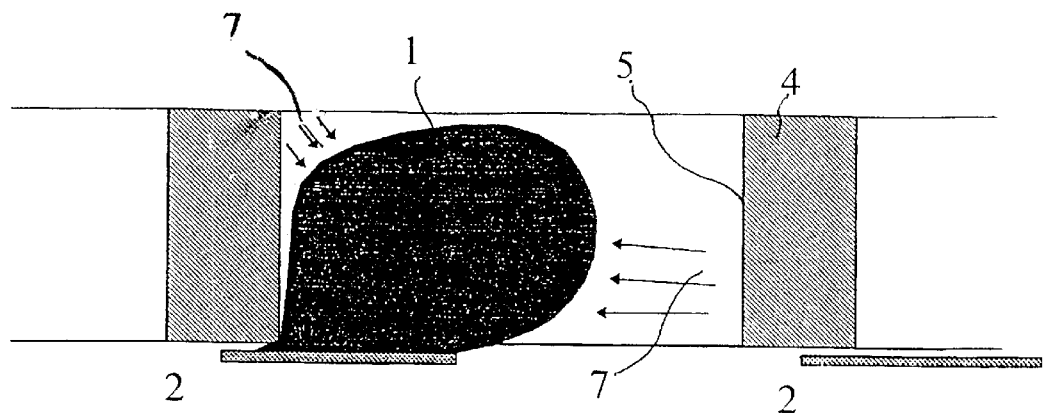
FIGS. 1 and 2 illustrate some of the problems encountered in the making of beads by silk-screening, to which the invention intends to provide a solution.
Figure 2:
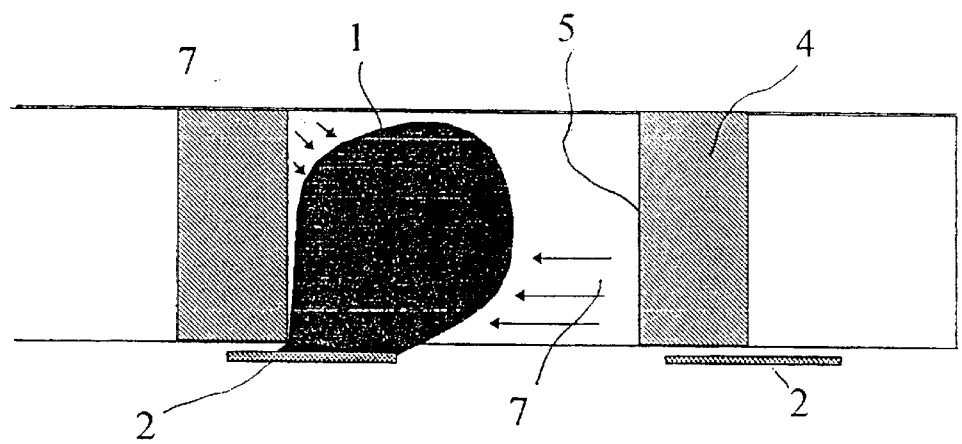

FIG. 1 shows an operation for making and soldering an electrical connection bead on metal contact surface 2 of electronic component 3 (not shown to simplify FIGS. 1 and 2). The solder paste used has appropriate rheology properties and includes metal microbeads likely to gather into a bead through hot coalescence during the reflow liquefaction of the microbeads and soldering to contact surface 2, and an organic binder or flux that will be denatured by the reflow and that will have to be removed after the reflow with a cleaning operation when the bead or beads, item 1, have solidified.

At least one stencil, item 4, is used having a thickness and dimensions of holes 5 and spacing between the holes according to the pitch of the beads to be made and their desired diameter. Holes 5 in the stencil are filled with solder paste by means of scraper 6 or an equivalent tool (not shown in FIGS. 1 and 2).

After the holes of the stencil have been filled, a high temperature reflow is performed to generate the formation of the bead through liquefaction and coalescence of the microbeads and denaturing of the organic binder that will have to be cleaned.

If there is a misalignment between stencil 4 and contact surfaces 2 of electronic component 3, the bonding surface of bead 1 with contact surface 2 will be very weak. This can result in the beads being pulled off when the stencil is removed, if done after solidification.

Should the stencil serving as a mold be removed after solidification of the alloy following reflow, one finds that the alignment of the beads is not exact along the "x" and "y" axes defining the plan on which they are laid out. One also observes variations in the height and shape of the beads, which could place the result outside of the tolerances of the JEDEC standard.

These significant inconsistencies in height or shape, and misalignments or poor alignments are the result of the mechanical stresses, arising, on the one hand, from the flux residues during the setting of the alloy because this is when the available volume in the mold is split into alloy and residues. On the other hand, an offset of the center lines, which is always possible, no matter how minor, of the stencil-mold with regard to the tabs of the contact surfaces is a characteristic which creates disequilibrium in a bead obtained by reflow.

In fact, the ball will naturally seek an equilibrium position, and will, therefore, take a non-spherical position to allow it to equilibrate the surface tensions and stresses exercising themselves, in this case, in a non-symmetrical fashion.

It is possible to correct these flaws by performing a second reflow after the initial reflow, setting, and removal of the stencil-mold. Provided that the residues of the denatured flux have been eliminated, since the beads are not subject to any external stress from the stencil-mold, which is absent at this stage of the process, the beads should theoretically find their equilibrium position and take on perfectly aligned positions and a spherical shape.

Actually, the second reflow is not sufficient in itself, the flux having been denatured and eliminated by cleaning, and the result obtained will not be perfect with regard to the alignment of the beads as well as their sphericity and/or their height or diameter.

It is necessary to add some solder flux prior to the second reflow. After that, the denatured flux will have to be removed by another cleaning. Therefore, the method with two reflows turns out to be quite complex.

Actually, the end result obtained is only satisfactory in appearance: in fact, on the one hand, the two successive thermal reflow cycles could affect the useful life of the component, especially if a microchip is mounted onto the substrate before producing the beads, and, on the other hand, two successive meltings by their nature increase the intermetal thickness between the support and the reception segment, which could affect the mechanical resistance of the ball on the reception segment.

FIG. 1 shows the stencil off center in the case of a 1-mm pitch: in this case the bead is adhering well to the contact surface.

FIG. 2 shows the stencil off center by an amount identical to that of FIG. 1, but in this case the pitch is 0.8 mm; the surface adhering to the contact surface is much smaller. The misalignment between the stencil and the contact surfaces of the component may be the result of poor positioning of the stencil or be caused by differential expansion between the stencil and the substrate due to the heat of the reflow. In any event, if stencil 4 is removed after the paste forming the bead undergoes reflow and the bead solidifies, the beads have been found to be imperfectly aligned and show variations in shape and height.

Regardless of a misalignment of the stencil, these bead alignment errors and these differences in bead height are caused by the mechanical stresses imposed by the flux residues (item 7 in FIGS. 1 and 2), and on the other hand the walls of the stencil mold, with the stresses being illustrated by arrows when the flux separates from the microbead alloy when changing to the liquid state and which occupies a portion of the cavity in hole 5 of the mold, thus generating stresses there on the molten alloy during solidification. These stresses can prevent the production of a perfectly spherical bead and/or position it off center in relation to tab 2 or the contact surface since the cooling bead in the stencil acting as a mold will naturally seek an equilibrium position and, for this reason, will take on a non-spherical shape allowing it to achieve an overall equilibrium with the surface tensions being exerted non-symmetrically. While cooling, the beads will remain in this condition.

According to the process of this invention, once the holes in the stencil have been filled, a single paste reflow operation by heating is done. During this operation stencil-mold 4 is kept in place on the component and it is removed or separated from component 3 during or after the reflow, but prior to bead solidification, with the beads still being in the liquid state so that they can find their equilibrium position themselves.

At this stage of the process, even if the stencil is poorly aligned with the contact surfaces it does not prevent the formed beads, still in the liquid state, from wetting the contact surface. A minimum amount of contact surface 2 placed opposite the molten alloy is enough to hold the bead when the stencil is removed.

Figure 3:
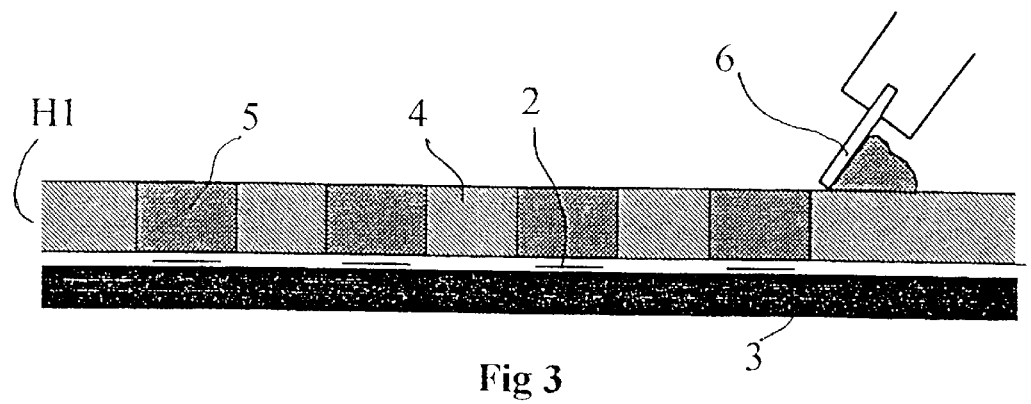
FIGS. 3 to 5 represent one embodiment of the connection beads according to the process of the invention with a stencil-mold.

FIG. 3 shows the filling of solder paste into holes 5 of stencil 4 placed on the electronic component or substrate, with the holes being opposite metal contact surfaces 2.

Figure 4:
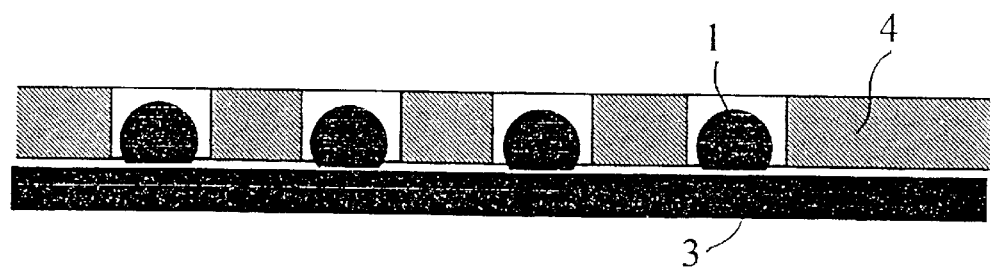

FIG. 4 illustrates the formation of beads 1 by coalescence during high temperature reflow, with stencil-mold 4 in place.

Figure 5:
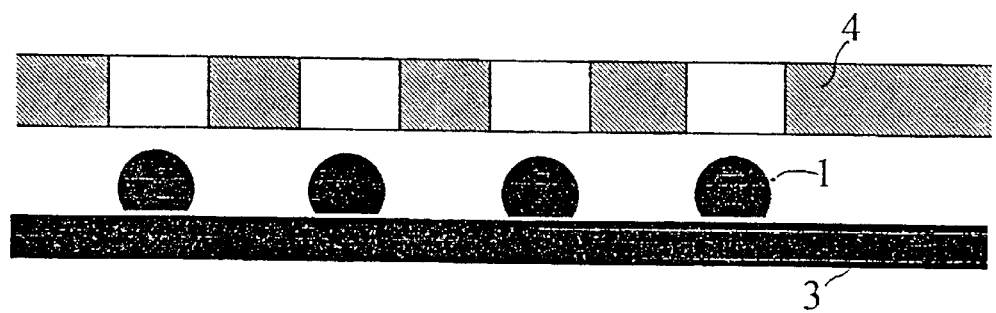
Figure 6:
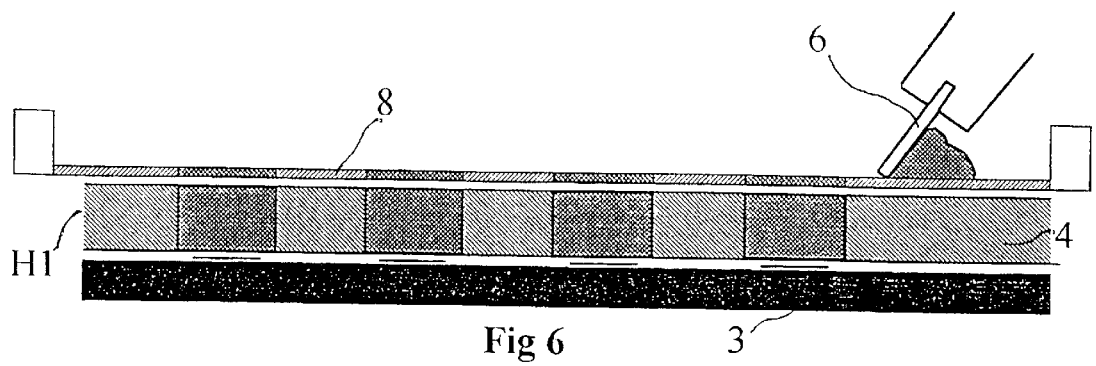
FIGS. 6 through 9 represent another embodiment of connection beads according to the process of the invention.
Figure 7:
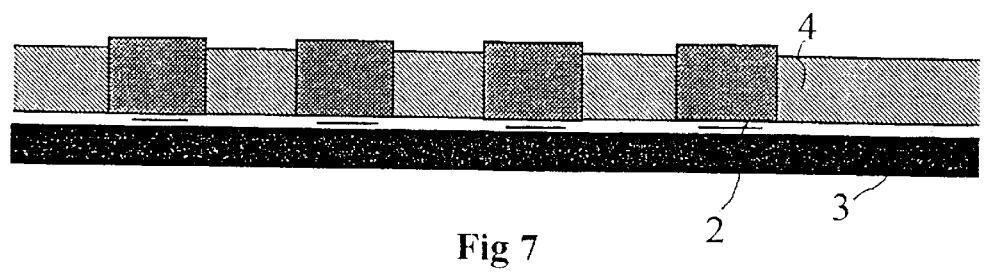
Figure 8:
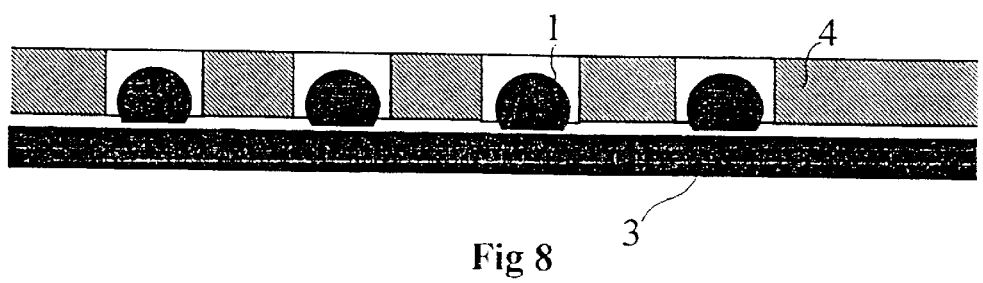
Figure 9:
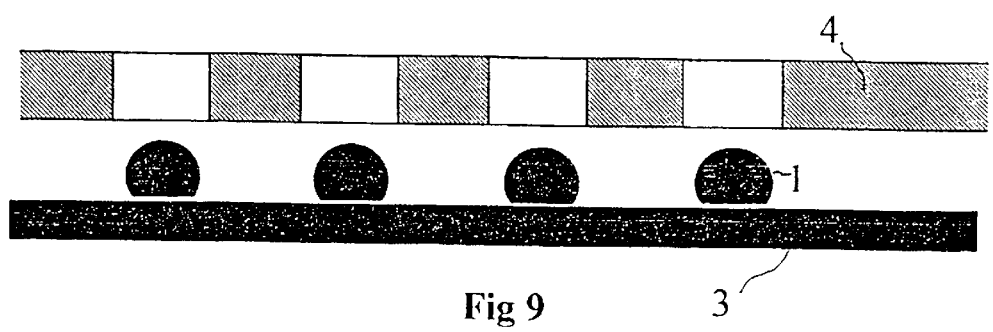

FIG. 5 illustrates the removal of stencil-mold 4 during or after reflow and prior to solidification of beads 1.

The molten alloy in contact with the wettable metal contact surface takes the shape of a sphere or a spherical bubble because in this configuration the surface tensions are minimal; however, if the slightest mechanical stress is applied to the molten alloy, it will assume a random shape and will solidify in that random shape. If oxides are present during reflow, they will also cause stresses that distort the spherical bubble, hence the need for flux to strip the surfaces. After solidification, the flux or binder that was denatured is removed by cleaning.

FIGS. 6 through 9 show another embodiment of the invention according to the invention's process; this one uses a solder paste as mentioned previously, which is deposited on the contact surfaces of the component by silk-screening. Two overlapping stencils whose holes line up with each other are used for this purpose.

The first stencil 4, the thickness stencil, is the one used in the previous case. The second stencil 8, the transfer stencil, is very thin. The thickness H1 of the first stencil and the dimensions of its holes are determined by the pitch of the beads to be made and their diameter. The holes in the second stencil 8 are identical in shape to those of the first stencil 4, which they overlap.

After filling the holes with paste using a scraper, the second stencil 8 is removed. A high temperature reflow is performed with the first stencil 4 remaining in place on the component. Then, with the beads having formed by coalescence of the metal alloy particles in the paste, the first stencil is removed before solidification, either after or during the melting, which is commonly called reflow, during the liquid phase of the beads and the denatured binder is cleaned away after solidification of the beads. The beads in an equilibrium position find their equilibrium position themselves and their identical and rigorously spherical shape regardless of their numbers.

The first stencil 4 of the invention is capable of withstanding the reflow temperature. It must be made of a material that cannot be soldered by the paste. The first stencil is advantageously made of a stainless metal such as titanium or a synthetic material, for example teflon.

Advantagously, the first stencil is made of a stainless metal such as titanium or a synthetic material, such as teflon, or it can be made of polyamide resin, or epoxy resin, or a non-wettable and non-solderable synthetic with fiberglass matrix. Stencil 4 can be of the same, or similar, nature as the substrate, or component 3, on which it is applied. Preferably, stencil 4 is made of a material with a low surface energy.

The second stencil 8 may be made of any material conventionally used to make stencils, such as metal or polyester. The purpose of the second stencil is to allow for a transfer which completely fills the holes in the first stencil while masking certain areas, if so desired.

When the stencil is removed (FIGS. 5 to 9), the liquid bead is deformed by the stresses to which it is subjected on account of the friction on the walls of the cavity formed by the corresponding hole in the stencil-mold and by the wall's surface energy. However, since the stencil of the invention cannot be wet by the liquid alloy, the bead remains attached to the contact surface.

When the bead is free from the hole in the stencil where it was created, it spontaneously takes its final position in the perfect center of the contact surface and assumes a perfectly spherical shape because the molten alloy is no longer subjected to any mechanical action either by the stencil or the flux residues, since these residues are now in the liquid state and have a density considerably lower than that of the molten alloy. As a result, these residues do not provide any significant mechanical resistance during the final shaping of the alloy sphere.

According to the process of the invention, examples of bead height have been obtained as follows:

The process of the invention makes it possible, for example, to make beads in the following configurations:

| Beads with a pitch of (in mm) | 1.27 | 1.00 | 0.80 | 0.50 |
|---|---|---|---|---|
| Thickness of thickness stencil | 0.40 | 0.35 | 0.30 | 0.20 |
| Thickness of transfer stencil | 0.10 | 0.10 | 0.10 | 0.075 |
| Hole diameter | 1.1 | 0.90 | 0.60 | 0.35 |
| Bead height reached | 0.60 | 0.50 | 0.40 | 0.25 |

For pitches of 1.27 and 1 mm, the JEDEC standard requires a bead height of 0.60 and 0.50 mm, respectively, with a tolerance of plus or minus 0.1. Taking into account these requirements, a statistical analysis of 125 parts made according to the invention yielded the following results:

| | Pitch of 1.27 | Pitch of 1.00 |
|---|---|---|
| $C_p = (T_s - T_i)/6\sigma$ | 2.40 | 2.60 |
| $C_{pk}$ = Mini $(T\sigma - x)/3\sigma$ or $(x - T_i)/3\sigma$ | 2.00 | 2.307 |

$T_s$: Upper tolerance
$T_i$: Lower tolerance
$\sigma$: Standard deviation
x: Average of the values
$C_p$: Process capability
$C_{pk}$: Centering of the process capability As can be seen, values of Cpk greater than 1.33 show that the process makes it possible to properly control the size of the spherical bubbles.

According to the invention, stencil 4, the stencil-mold or thickness stencil, is made of a non-wettable synthetic material consisting of epoxy resin, polyamide resin, or Teflon® (polytetrafluoroethylene), with or without a fiberglass matrix. The fiberglass provides the stencil with rigidity, even in the smallest thicknesses. The epoxy resin or polyamide resin has the benefit of having a low surface energy. The higher the surface energy of a material, the more a liquid will cling to it, and vice versa.

In order not to draw away the alloy when separating stencil 4 from the molten alloy, it is important for the stencil to have the lowest possible surface energy. The surface energy of metals is relatively high, greater than 1000 millijoules per m$^2$, whereas organic material, such as epoxy resin or polyamide resin, has a surface energy of about 50 millijoules per m$^2$, enabling easy separation between the molten alloy and the stencil.

In addition, metallic materials may have physical and chemical inconsistencies (cracks, oxidizing) that may cause the molten alloy to cling.

Another benefit of stencils made of the above-mentioned materials, whether epoxy or polyamide resin, is that the substrate used as the base for the components is generally of the same or equivalent type, for example epoxy or polyamide resin, and its expansion coefficient is equal or close to that of the stencil's material. When the substrate and stencil assembly is subjected to the reflow temperature of approximately 220° C., this provision of the invention prevents the problem of differential expansion causing a misalignment that would certainly occur if the substrate and stencil materials had different expansion coefficients.

Figure 10:
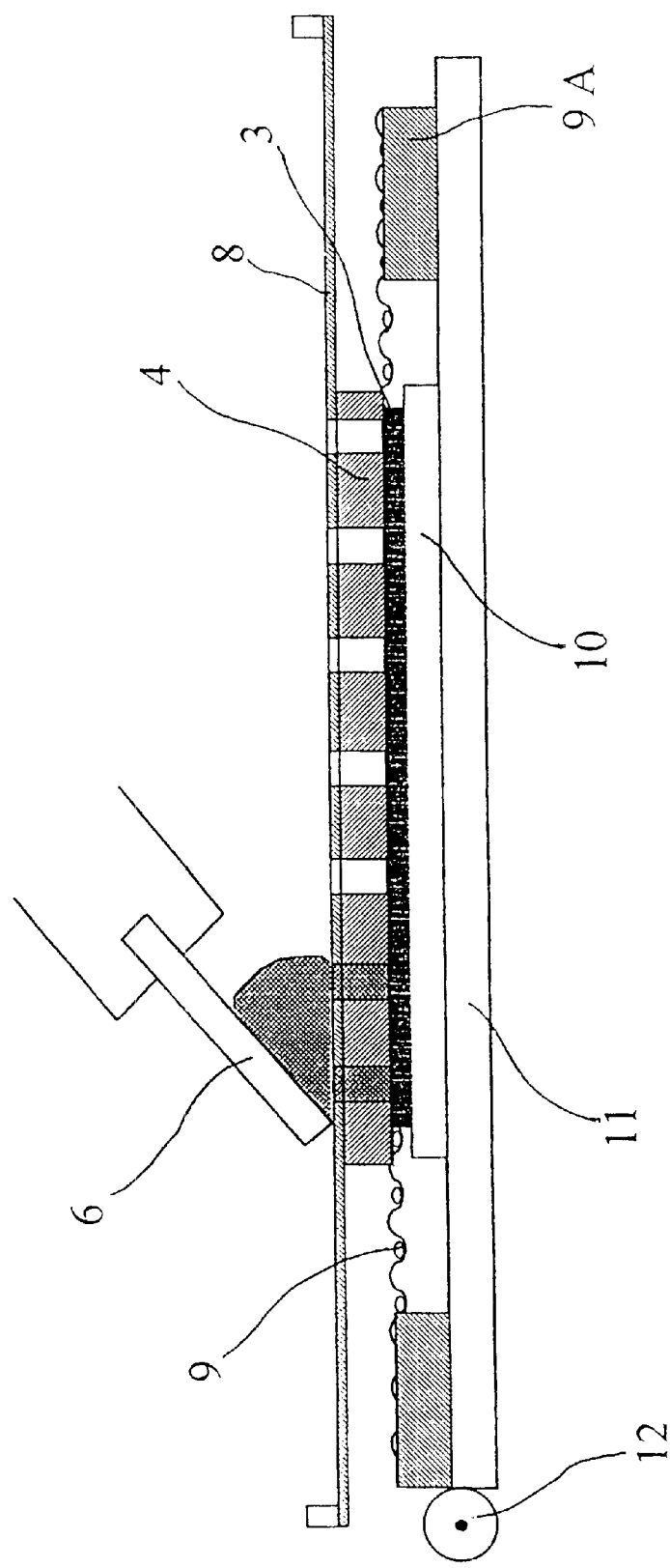
FIGS. 10 and 11 show, as an example, but not limited thereto, a device for implementing the method object of the invention.
Figure 11:
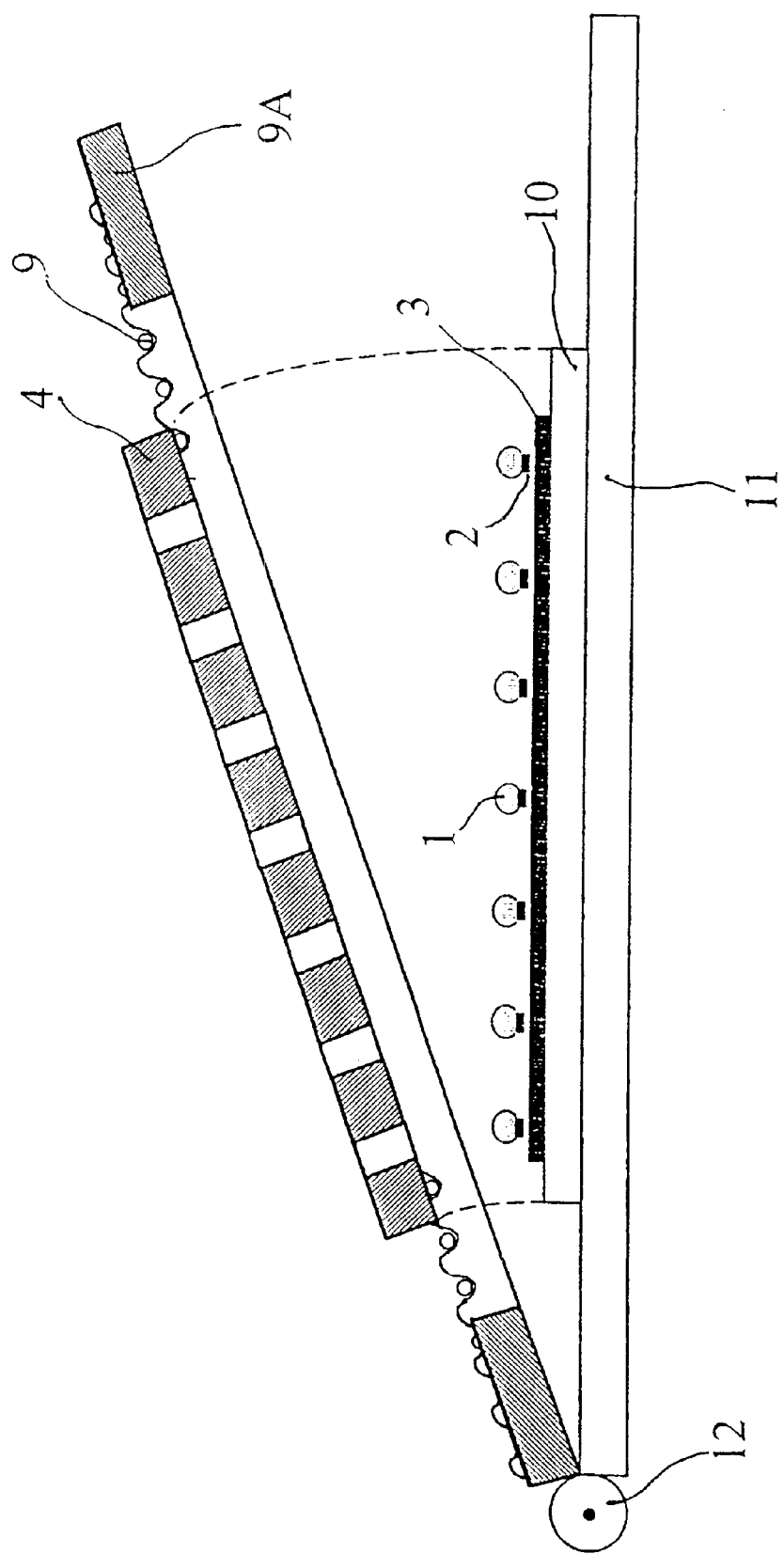

FIGS. 10 and 11 show a device for implementing the process of this invention. The device includes molded stencil 4 and upper stencil 8, as in the embodiment of FIGS. 6 to 9. Stencil 4 is suspended from a stainless-steel wire mesh fabric, 9, which is in turn stretched over rigid frame 9A preferably made of metal. The assembly is perfectly flat and non-distortable; only stencil 4 distorts in the same plane due to surface expansion when it is heated.

Any other type of elastic flexible mesh withstanding the reflow temperature may be used.

Circuit 3, that will receive the beads 1, is placed on base 10 in order to compensate for height differences and be positioned precisely. Base 10 is itself placed on plate 11 to hold the assembly in the silk-screening machine and in the oven. Frame 9A, acting as a stencil holder, is connected to plate 11 by hinge 12.

With stencil 4 hanging from stainless-steel mesh 9 of frame 9A, it can be pressed perfectly against the substrate during the silk-screening and paste-reflow phase, thus preventing the alloy microbeads from migrating beneath stencils 4 and 8 and ensuring that the solder paste in the holes of stencil 4 always stays in contact with the contact surfaces to allow for a heat exchange and adhesion between the contact surfaces and the solder paste. Otherwise, if the paste and the alloy it contains are not in contact with the corresponding contact surface, the alloy bead to be formed will be surrounded by flux residues and will remain in the stencil.

It is, therefore, important for thickness stencil 4 or the stencil-mold to be pressed against substrate 3 while allowing some relative movement between the stencil and the substrate in the x, y plane so as to avoid any stress at the time of heating, especially if the heating is not perfectly homogeneous over the entire surface.

Stainless-steel mesh 9 stretched over frame 9 enables this pressing with freedom of movement. Stainless-steel mesh 9 is an elastic link between support frame 9A and thickness stencil 4, which, therefore, always remains flat and taut and does not bend. In addition, this stainless-steel mesh acts as a thermal barrier between the frame and thickness stencil, that is, if the support frame, which has a high thermal mass, is not at the same temperature as the thickness stencil and substrate, it will not thermally disrupt the thickness stencil. Any other elastic mesh withstanding these temperatures also may work.

During the operation of transferring the solder paste by silk-screening, stencil holder 9A is pressed against base 11. At this stage stencil 4 is pressed against circuit 3 by simple gravity.

This assembly is directed toward the reflow oven. An appropriate thermal profile brings the solder paste to the liquid state. Heating of the part must be done under controlled conditions to allow for gradual evaporation of the solvents in the solder paste without boiling, and also to allow the flux residues to rise to the surface. If these two points are not reached, the alloy will not remain in contact with the contact surface and the alloy bead will remain stuck to the stencil. Cooling shall also be done under controlled conditions, and gradually, to avoid shrinkage marks.

When the solder is still in the liquid state a mechanical device, not illustrated, makes it possible to gradually separate stencil holder 9A from circuit base 3 by rotation about hinge 12. The beads are thus separated very gently from the stencil from the front to the back. Once separation is complete, the assembly must still be kept molten for at least 5 seconds so that the last separated beads may reposition themselves and take shape.

Lastly come the cooling and cleaning. The cleaning is preferably done after separation of the circuit from its base. Each part is cleaned separately.

What is claimed is:

1. A process for making and soldering electrical connection beads (1) to electrical connection contact surfaces (2) of electronic circuits or components (3) using a first stencil (4) having a number of holes opposite said contact surfaces, with said stencil not being wettable by a molten paste and a solder paste deposited by silk-screening, comprising the steps of:

placing the first stencil, with a thickness and hole dimensions determined by the pitch of the connection beads to be made and their diameter, on the substrate consisting of the circuit or electronic component, with the holes aligning with the contact surfaces;

filling said holes with solder paste using a spreading tool, with the first stencil in place on the substrate; and performing a reflow with the first stencil in place on the substrate, wherein during the reflow the solder paste is heated forming molten metal beads and subsequently solidifying the molten metal beads to form the connection beads and wherein the first stencil (4) and the substrate are separated before solidification to form the connection beads while the molten metal beads are still in the liquid state, so that the connection beads being formed find their equilibrium position and their rigorously-identical spherical shape regardless of their numbers.

2. A process far making and soldering electrical connection beads (1) to electrical connection contact surfaces (2) of electronic circuits or components (3) according to claim 1, the solder paste comprising a binder, wherein the reflow denatures the binder and wherein cleaning of the denatured binder is done after solidification of the molten metal beads.

3. A process according to either one of claims 1 or 2, wherein a second stencil sitting atop the first is used;

the second stencil (8) placed on the first stencil (4) and whose holes are identical to those of the first stencil and overlap them;

the filling is done in the holes of the first and second stencils; and the second stencil (8) is removed prior to the reflow stage.

4. A process according to claim 1 in which said first stencil is made of a non-wettable synthetic material having a fiberglass matrix.

5. A process according to claim 4 in which said first stencil (4) is made of epoxy resin.

6. A process according to claim 4 in which said first stencil (4) is made of polyamide resin.

7. A process according to claim 4 in which said first stencil (4) is made of polytetrafluoroethylene.

8. A process according to claim 4 in which said first stencil (4) is made of a stainless metal.

9. A process according to claim 4 in which said first stencil (4) is made of stainless steel.

10. A process according to claim 4 in which said first stencil (4) is made of titanium.

11. A process according to claim 1 characterized by the fact that the first stencil (4) is hung from a wire mesh fabric made of stainless metal (9) stretched over a rigid frame (9A).

12. A process according to claim 1 characterized by the fact that the first stencil (4) is hung from a mesh fabric withstanding the reflow temperature.

* * * * *